(12) United States Patent
Fukushima et al.

(10) Patent No.: US 12,388,159 B2
(45) Date of Patent: Aug. 12, 2025

(54) WIRING MODULE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Naoki Fukushima, Mie (JP); Osamu Nakayama, Mie (JP); Katsushi Miyazaki, Mie (JP); Mitsutoshi Morita, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 417 days.

(21) Appl. No.: 18/014,233

(22) PCT Filed: Jun. 29, 2021

(86) PCT No.: PCT/JP2021/024475
§ 371 (c)(1),
(2) Date: Jan. 3, 2023

(87) PCT Pub. No.: WO2022/014314
PCT Pub. Date: Jan. 20, 2022

(65) Prior Publication Data
US 2023/0261332 A1    Aug. 17, 2023

(30) Foreign Application Priority Data
Jul. 14, 2020 (JP) ................. 2020-120517

(51) Int. Cl.
H01M 50/507 (2021.01)
H01M 50/519 (2021.01)
H05K 1/11 (2006.01)

(52) U.S. Cl.
CPC ....... *H01M 50/519* (2021.01); *H01M 50/507* (2021.01); *H05K 1/118* (2013.01);
(Continued)

(58) Field of Classification Search
None
See application file for complete search history.

(56) References Cited

U.S. PATENT DOCUMENTS

| | | | |
|---|---|---|---|
| 2011/0024205 A1* | 2/2011 | Nishihara | H01M 10/48 429/90 |
| 2012/0328920 A1 | 12/2012 | Takase et al. | |

(Continued)

FOREIGN PATENT DOCUMENTS

| | | | |
|---|---|---|---|
| CN | 209912949 | 1/2020 | |
| CN | 112105137 A * | 12/2020 | .......... H01M 2/1077 |

(Continued)

OTHER PUBLICATIONS

International Search Report issued in International Bureau of WIPO Patent Application No. PCT/JP2021/024475, dated Sep. 7, 2021, along with an English translation thereof.

*Primary Examiner* — Timothy J Thompson
*Assistant Examiner* — Paramita Ghosh
(74) *Attorney, Agent, or Firm* — Greenblum & Bernstein, P.L.C.

(57) ABSTRACT

A wiring module is to be attached to a battery cell stacked body in which a plurality of battery cells having an electrode terminal and being elongated in a front-rear direction are arranged in a horizontal direction, and is electrically connected to the battery cells, the wiring module including: a (Continued)

bus bar that is connected to the electrode lead; an FPC that is connected to the bus bar and extends in the front-rear direction; and a protector that holds the bus bar and the FPC, wherein the FPC includes: a plurality of extension parts that extend in the front-rear direction; an intersection part that extends in the horizontal direction; and a bending part, the extension parts are respectively coupled to two end portions of the intersection part in the horizontal direction, one of the extension parts includes the bending part in the vicinity of the intersection part.

9 Claims, 10 Drawing Sheets

(52) U.S. Cl.
CPC .............. *H05K 2201/10272* (2013.01); *H05K 2201/10984* (2013.01)

(56) References Cited

U.S. PATENT DOCUMENTS

| | | |
|---|---|---|
| 2019/0001838 A1 | 1/2019 | Choi et al. |
| 2019/0348720 A1 | 11/2019 | Oh et al. |
| 2019/0389318 A1 | 12/2019 | Lee et al. |
| 2020/0014005 A1 | 1/2020 | Lee et al. |
| 2021/0194101 A1* | 6/2021 | Kim ................... H01M 50/507 |

FOREIGN PATENT DOCUMENTS

| | | |
|---|---|---|
| JP | 2011-210710 | 10/2011 |
| JP | 2012-226969 | 11/2012 |
| JP | 2019-511810 | 4/2019 |
| JP | 2020-509545 | 3/2020 |
| JP | 2021-018955 | 2/2021 |
| KR | 20190061378 A * | 6/2019 |

* cited by examiner

WIRING MODULE

TECHNICAL FIELD

The present disclosure relates to a wiring module.

BACKGROUND ART

In a high-voltage battery pack used for electric automobiles or hybrid automobiles, in general, a large number of battery cells are stacked and electrically connected in series or in parallel by a wiring module. A wiring module described in JP 2019-511810A (Patent Document 1 listed below) is conventionally known as such a wiring module. The battery module described in Patent Document 1 includes a plurality of battery cells that each have electrode leads protruding along a front-rear direction of the battery module, and a bus bar unit that integrally couples the electrode leads of the battery cells. In this bus bar unit, a first bus bar that is connected to the electrode leads protruding forward and a second bus bar that is connected to the electrode leads protruding rearward are electrically connected to each other by a sensing bus bar.

CITATION LIST

Patent Documents

Patent Document 1: JP 2019-511810A

SUMMARY OF INVENTION

Technical Problem

In the foregoing configuration, it is conceivable to use a flexible printed circuit board for the sensing bus bar. However, if the sensing bus bar is formed using a flexible printed circuit board, the size of the flexible printed circuit board may be large depending on the configuration of the sensing bus bar. When manufacturing a large flexible printed circuit board, concerns including an increase in the scale of production facilities arise.

The present disclosure was completed in view of the foregoing circumstances. An object of the present disclosure is to provide a wiring module that uses a flexible printed circuit board that can be extended by folding the flexible printed circuit board, without involving an increase in the scale of production facilities.

Solution to Problem

A wiring module of the present disclosure is a wiring module that is to be attached to a power storage element group in which a plurality of power storage elements having an electrode terminal and being elongated in a first direction are arranged in a second direction intersecting the first direction, and that is electrically connected to the power storage elements, the wiring module including: a bus bar that is connected to the electrode terminal; a flexible printed circuit board that is connected to the bus bar and extends in the first direction; and a protector that holds the bus bar and the flexible printed circuit board, wherein the flexible printed circuit board includes a plurality of extension parts that extend in the first direction, an intersection part that extends in the second direction, and a bending part, two extension parts are respectively coupled to two end portions of the intersection part in the second direction, one of the two extension parts includes the bending part in the vicinity of the intersection part, and the two extension parts extend to opposite sides in the first direction with respect to the intersection part as a result of the one extension part being folded at the bending part.

Advantageous Effects of Invention

According to the present disclosure, it is possible to provide a wiring module that uses a flexible printed circuit board that can be extended by folding the flexible printed circuit board, without involving an increase in the scale of production facilities.

DESCRIPTION OF EMBODIMENTS

First, embodiments of the present disclosure will be listed and described.

(1) A wiring module of the present disclosure is a wiring module that is to be attached to a power storage element group in which a plurality of power storage elements having an electrode terminal and being elongated in a first direction are arranged in a second direction intersecting the first direction, and that is electrically connected to the power storage elements, the wiring module including: a bus bar that is connected to the electrode terminal; a flexible printed circuit board that is connected to the bus bar and extends in the first direction; and a protector that holds the bus bar and the flexible printed circuit board, wherein the flexible printed circuit board includes a plurality of extension parts that extend in the first direction, an intersection part that extends in the second direction, and a bending part, two extension parts are respectively coupled to two end portions of the intersection part in the second direction, one of the two extension parts includes the bending part in the vicinity of the intersection part, and the two extension parts extend to opposite sides in the first direction with respect to the intersection part as a result of the one extension part being folded at the bending part. In this example, the vicinity of the intersection part where the bending part is positioned falls within a range in which, when the flexible printed circuit board is folded, the entire length of the flexible printed circuit board in the first direction is longer than the entire length of the flexible printed circuit board in the non-folded state.

According to this configuration, it is possible to provide a wiring module that uses a flexible printed circuit board extending in the first direction by folding the flexible printed circuit board, without involving an increase in the scale of production facilities.

(2) The flexible printed circuit board includes: at least one connector, a counterpart connector that fits to the at least one connector, and two or more divided flexible printed circuit boards that are electrically connected to each other by fitting the connector and the counterpart connector to each other, and the intersection part absorbs misalignment of the connector and the counterpart connector in the second direction.

According to this configuration, it is easy to attach the wiring module formed of two or more divided flexible printed circuit boards to the power storage element group.

(3) In the second direction, a pair of the intersection parts are preferably disposed between a pair of the extension parts.

According to this configuration, it is possible to improve the yield of the flexible printed circuit board.

(4) It is preferable that the flexible printed circuit board includes an insulating base film, a conductor layer that is laminated on only one side of the base film, and a cover film that covers at least a portion of the conductor layer, and an even number of the bending parts are provided.

According to this configuration, it is possible to expose the conductor layer on the same side at two end portions of the flexible printed circuit board in the first direction by folding the flexible printed circuit board an even number of times.

(5) Two bending parts are preferably provided.

According to this configuration, it is possible to expose the conductor layer on the same side at two end portions of the flexible printed circuit board in the first direction with the flexible printed circuit board being bent the minimum number of times. The structure can be simplified with the minimum number of bends.

(6) It is preferable that the extension part disposed on one side and the intersection part disposed on the other side centered around the bending part are arranged so as to overlap each other in a third direction intersecting the first direction and the second direction, and the overlapping portion is fixed by a fixing part.

According to this configuration, it is possible to suppress the bending part from being displaced by an external force or the like.

(7) A pair of notches are preferably respectively provided at two end portions of the bending part.

According to this configuration, it is easy to find the position of the bending part. In addition, a reactive force generated when bending the flexible printed circuit board is reduced, and thus the flexible printed circuit board can be easily bent.

(8) The flexible printed circuit board includes a land, and the land is connected to at least one side surface of the bus bar through soldering.

(9) The land is preferably connected to only one side surface of the bus bar through soldering.

According to this configuration, it is possible to improve the work efficiency of soldering between the land and the bus bar.

DETAILS OF EMBODIMENTS OF PRESENT DISCLOSURE

Hereinafter, embodiments of the present disclosure will be described. It should be noted that the present disclosure is not limited to the examples herein, but rather is indicated by the scope of claims, and is intended to include all modifications within a meaning and scope equivalent to the scope of claims.

First Embodiment

A first embodiment of the present disclosure will be described with reference to FIGS. 1 to 6. A battery module 1 including a wiring module 10 of the present embodiment is installed in a vehicle such as an electrical automobile or a hybrid automobile, as a power source for driving the vehicle, for example. In the following description, the direction indicated by the Z arrow is defined as the upper direction, the direction indicated by the X arrow is defined as the forward direction, and the direction indicated by the Y arrow is defined as the leftward direction. The front-rear direction is an example of a first direction, the horizontal direction is an example of a second direction, and the vertical direction is an example of a third direction. For a plurality of identical members, a reference sign may be given to only some, and may be omitted from the others.

Battery Module

Figure 1:
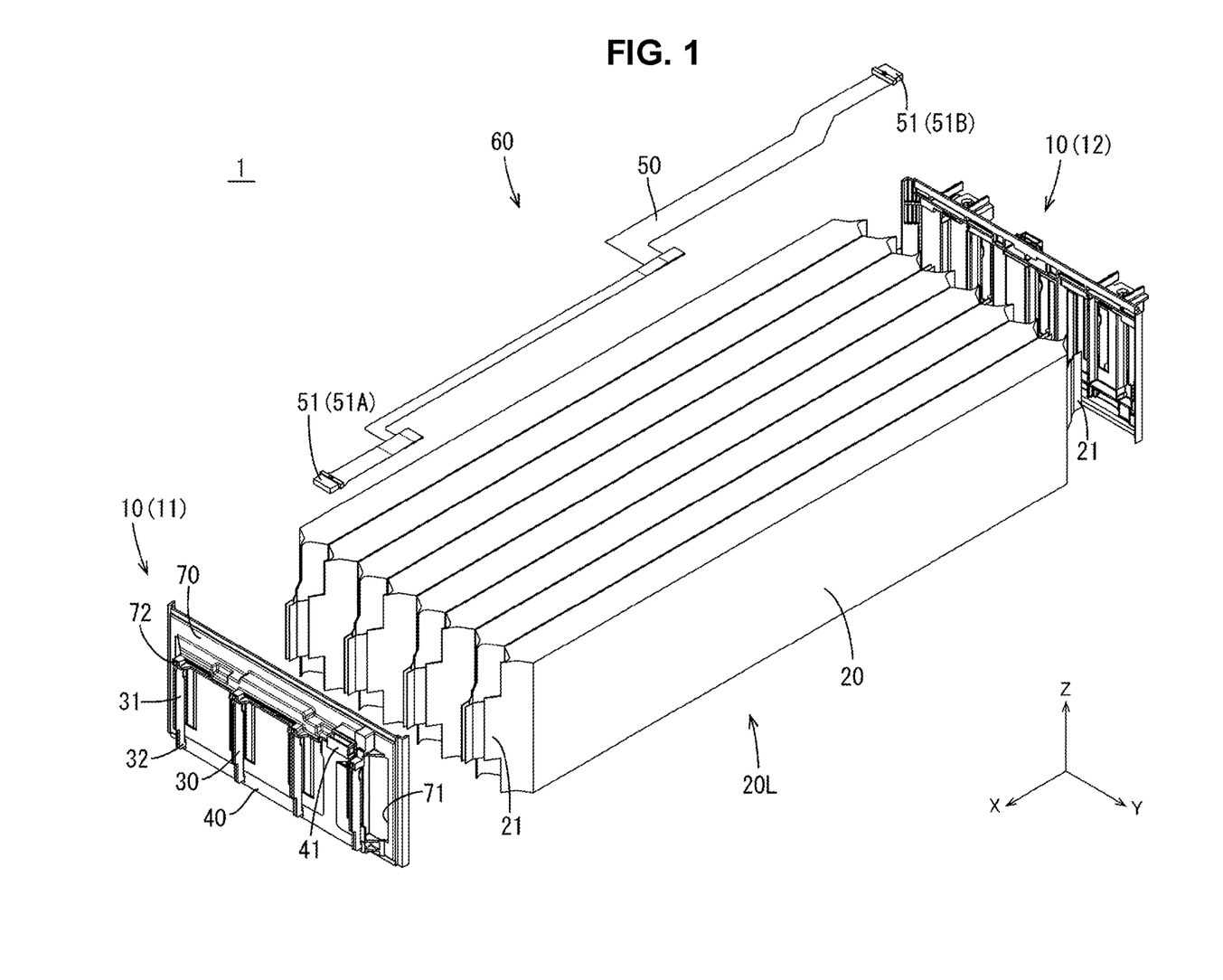
FIG. 1 is an exploded perspective view of a wiring module and a battery cell stacked body according to a first embodiment.

As shown in FIG. 1, the battery module 1 of the first embodiment includes a battery cell stacked body 20L (an example of a power storage element group) and the wiring module 10 attached to the battery cell stacked body 20L.

Battery Cells and Electrode Leads

The battery cell stacked body 20L is formed by arranging a plurality of battery cells 20 (an example of power storage elements) in the horizontal direction. The battery cells 20 are formed to be elongated in the front-rear direction and flat in the horizontal direction as shown in FIG. 1. Power storage elements (not shown) are housed in the battery cells 20. Each of the battery cells 20 includes a pair of electrode leads 21 (an example of electrode terminals). The pair of electrode leads 21 are disposed on two sides of the battery cells 20 in the front-rear direction so as to protrude in opposite directions. The pair of electrode leads 21 each have a plate shape, the polarities thereof being opposite. That is, the electrode lead 21 on one side in the front-rear direction of the battery cell is negative, and the electrode lead 21 on the other side is positive.

In the present embodiment, the battery cells 20 are secondary batteries such as lithium-ion batteries.

As shown in FIG. 1, the battery cell stacked body 20L includes the electrode leads 21 protruding forward of the battery cells 20 and the electrode leads 21 protruding rearward of the battery cells 20. The wiring module 10 in the present embodiment is attached to the front side and the rear side of the battery cell stacked body 20L and electrically connects the electrode leads 21 of the battery cells 20 on either side as described below. The electrode leads 21 of the battery cell stacked body 20L are bent as appropriate and cut to a necessary length for connection with the wiring module 10.

Wiring Modules and Flexible Printed Circuit Board

The wiring module 10 includes bus bars 30 connected to the electrode leads 21, a flexible printed circuit board (hereinafter, abbreviated as FPC) 60 connected to the bus bars 30, and a protector 70 that holds the bus bars 30 and the FPC 60. The FPC 60 includes protector-side FPCs 40 (an example of a divided flexible printed circuit board), a connector 41 that is provided at the upper end portion of each protector-side FPC 40, a relay FPC 50 (an example of a divided flexible printed circuit board), and counterpart connectors 51 that are provided at the front end portion and the rear end portion of the relay FPC 50 and are respectively fitted to the connectors 41. The connectors 41 and the counterpart connectors 51 are fittable to and separatable from each other, and thus the FPC 60 is provided so as to be dividable into separate members.

As shown FIG. 1, in the wiring module 10, the member attached to the front side of the battery cell stacked body 20L is defined as a first bus bar module 11, and the member attached to the rear side of the battery cell stacked body 20L is defined as a second bus bar module 12. The first bus bar module 11 and the second bus bar module 12 are electrically connected to each other by the relay FPC 50.

The first bus bar module 11 includes the bus bars 30 that are connected to the electrode leads 21 protruding forward, the protector-side FPC 40 that is connected to the bus bars 30, and the protector 70 that holds the bus bars 30 and the protector-side FPC 40. The connector 41 is provided at the upper end portion of the protector-side FPC 40. The connector 41 is connected to the bus bars 30 via the protector-side FPC 40. The connector 41 is fitted to the counterpart connector 51 that is connected to the relay FPC 50. The second bus bar module 12 is provided similarly to the first bus bar module 11, and is connected to the electrode leads 21 protruding rearward. Therefore, when the connectors 41 and the counterpart connectors 51 are respectively fitted to each other, the protector-side FPC 40 and the relay FPC 50 are electrically connected together, whereby the first bus bar module 11 and the second bus bar module 12 are electrically connected to each other.

Protector

The protector 70 is made of an insulating synthetic resin and has a plate shape as shown in FIG. 1. The protector 70 has a plurality of electrode receiving parts 71 arranged in parallel in the horizontal direction at the central portion of the protector 70 in the vertical direction. The plurality of electrode receiving parts 71 are formed so as to extend through the protector 70 in the front-rear direction and have a vertically elongated rectangular shape. The protector 70 has a groove part 72 provided on the upper side thereof for holding the bus bars 30.

Bus Bars

Each bus bar 30 has a plate-like shape and is formed by processing an electrically conductive metallic plate. As shown in FIG. 1, the bus bars 30 are held by the groove part 72 on the upper side of the protector 70 such that the thickness directions thereof coincide with the horizontal direction. The lower part of each bus bar 30 is provided with a connection part 32. The connection part 32 is connected to the protector-side FPC 40 through soldering. The central portion of the bus bar constitutes a main body part 31 to which the electrode lead 21 is connected. When the first bus bar module 11 is attached to the front side of the battery cell stacked body 20L, the electrode leads 21 protruding forward are inserted into the electrode receiving parts 71 of the protector 70, and the main body parts 31 are connected to the electrode leads 21 inserted into the electrode receiving parts 71 through laser welding.

Protector-Side FPC, Base Film, Conductive Paths, and Coverlay Film

Figure 4:
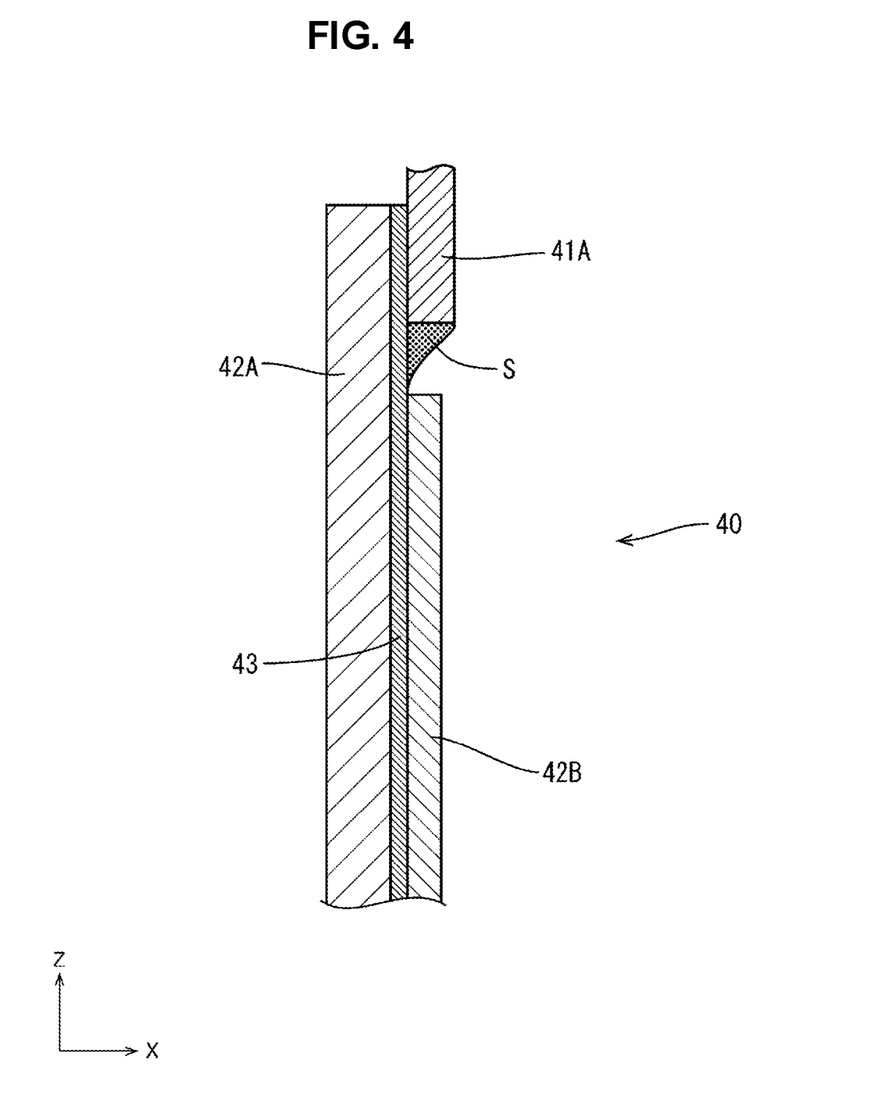
FIG. 4 is a cross-sectional view of the flexible printed circuit board that includes a conductive path connected to a connector.

As shown in FIG. 4, the protector-side FPC 40 includes a base film 42A, a plurality of conductive paths 43 (an example of a conductive layer) that are laminated on only one side of the base film 42A, and a coverlay film 42B (an example of a cover film) that covers the plurality of conductive paths 43 (the thicknesses of the base film 42A and the like appear larger than they actually are in FIG. 4 for the sake of description). That is, the protector-side FPC 40 is formed by a so-called single-sided FPC. The base film 42A and the coverlay film 42B are made of a synthetic resin such as polyimide having insulating properties and flexibility. The conductive paths 43 are held by the base film 42A from the rear side and are covered by the coverlay film 42B from the front side. The conductive paths 43 are formed by a metal foil of copper, a copper alloy, or the like. Although not shown in the drawings or described herein, the conductive paths 43 can be connected to any electronic component such as a resistor, a capacitor, or a transistor.

Connectors

Figure 7:
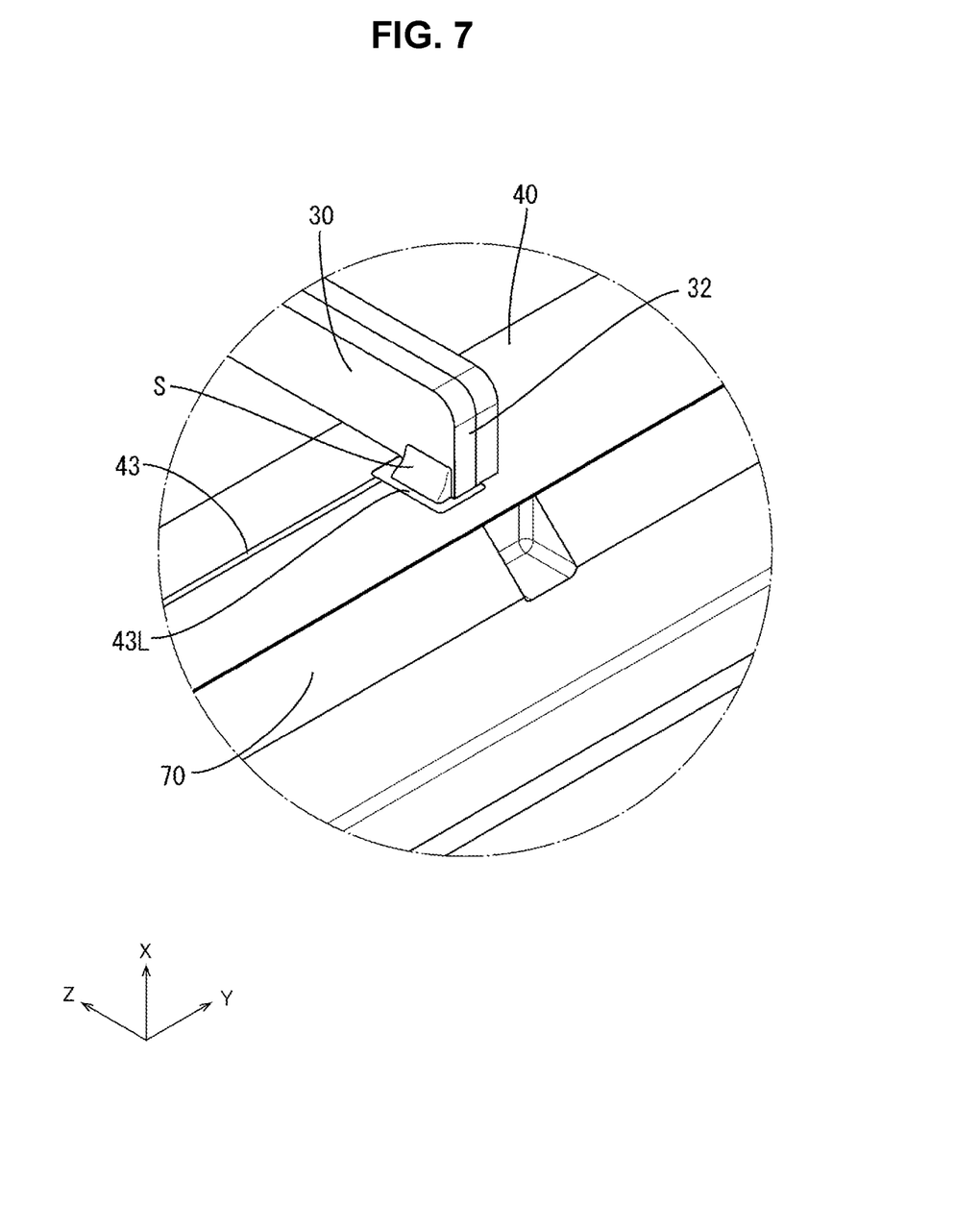
FIG. 7 is an enlarged perspective view of soldering between one side surface of a connection part of a bus bar and a land.

The protector-side FPC 40 has a vertically inverted T shape as shown in FIG. 1. The protector-side FPC 40 is fixed to the protector 70 using an adhesive or the like. The lower part of the protector-side FPC 40 is provided with a land 43L connected to the corresponding conductive path 43, as shown in FIG. 7. The land 43L is formed by a metallic foil similar to the conductive paths 43 and has a rectangular shape. Although not shown in the drawings, the coverlay film 42B on the front side of the land 43L is removed so as to expose the land 43L toward the front side. The land 43L is disposed on the right side of the connection part 32 of the corresponding bus bar 30, and is electrically connected to the right side surface of the connection part 32 of the bus bar 30 using solder S. In this manner, employing a configuration in which the land 43L and one side surface of the connection part 32 of the bus bar 30 are soldered to each other makes it possible to efficiently perform soldering using an ordinary soldering iron.

Figure 8:
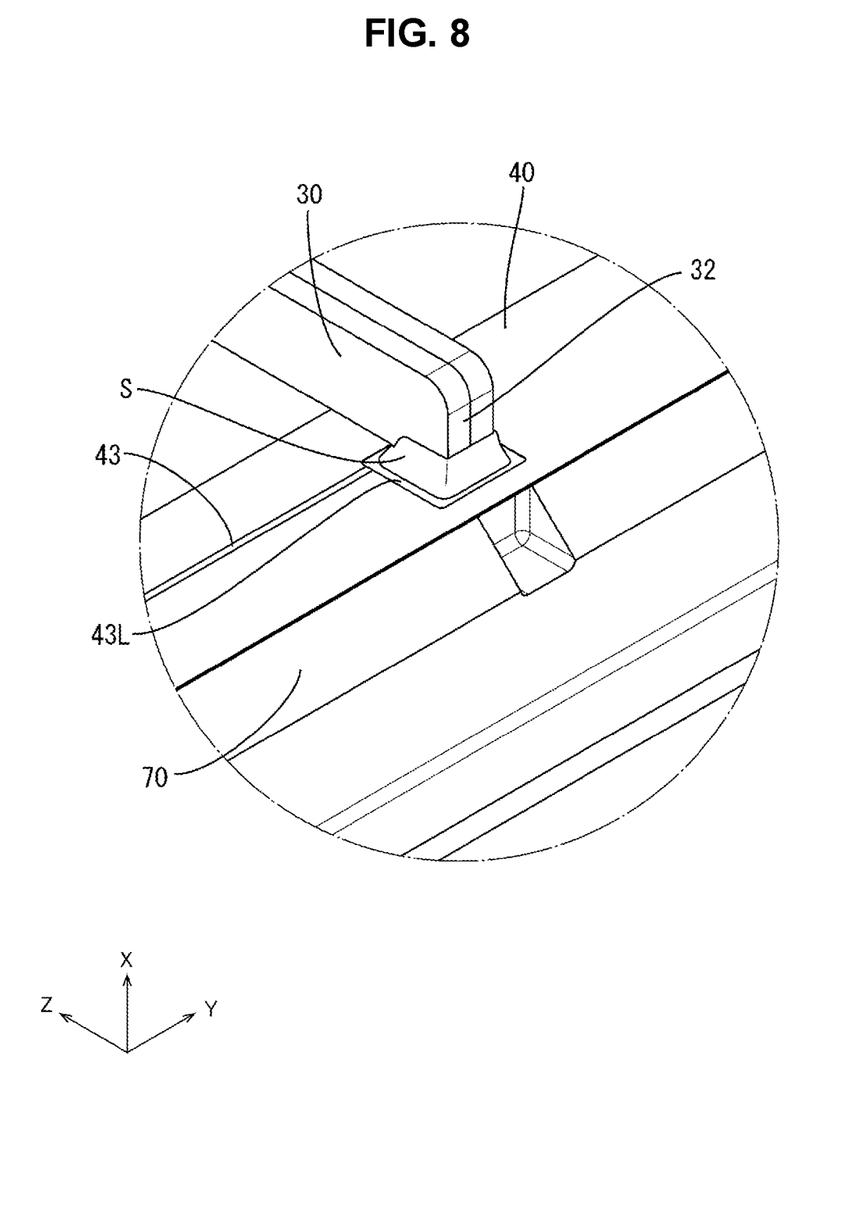
FIG. 8 is an enlarged perspective view of soldering between four side surfaces of the connection part of the bus bar and the land.

The land 43L may be disposed on the left and right sides of the connection part 32 of the bus bar 30 or at a peripheral edge portion of the same, and soldered to side surfaces of the connection part 32 of the bus bar 30. For example, as shown in FIG. 8, the land 43L may be disposed at the peripheral edge portion of the connection part 32 of the bus bar 30 and connected to the four side surfaces of the connection part 32 of the bus bar 30 using the solder S. In this case, increasing the portion connected using the solder S has the effect of stabilizing the bus bar 30 with respect to the protector-side FPC 40. This increases the number of side surfaces of the connection part 32 of the bus bar 30 to be soldered, which may affect work efficiency. However, work efficiency can be improved by using a special soldering iron in accordance with the shape of the connection part 32 of the bus bar 30, for example.

The connector 41 is open upward at the upper end of the protector-side FPC 40. As shown in FIG. 4, the conductive path 43 exposed by providing an opening in advance in the coverlay film 42B at the upper end portion of the protector-side FPC 40 is soldered to the connection part 41A of the connector 41 using the solder S and electrically connected to the connection part 41A of the connector 41. The conductive path 43 is shown in FIGS. 4, 7, and 8, and is not shown in the other drawings.

Also, the conductive paths 43 are electrically connected to external electronic control units (ECUs) (not shown). The ECUs are equipped with microcomputers and elements and have a known configuration that includes the functions of detecting voltages, currents, temperatures, and the like of the battery cells 20 and performing charging/discharging control of the battery cells 20.

Relay FPC, Base Film, Conductive Paths, and Coverlay Film

Figure 2:
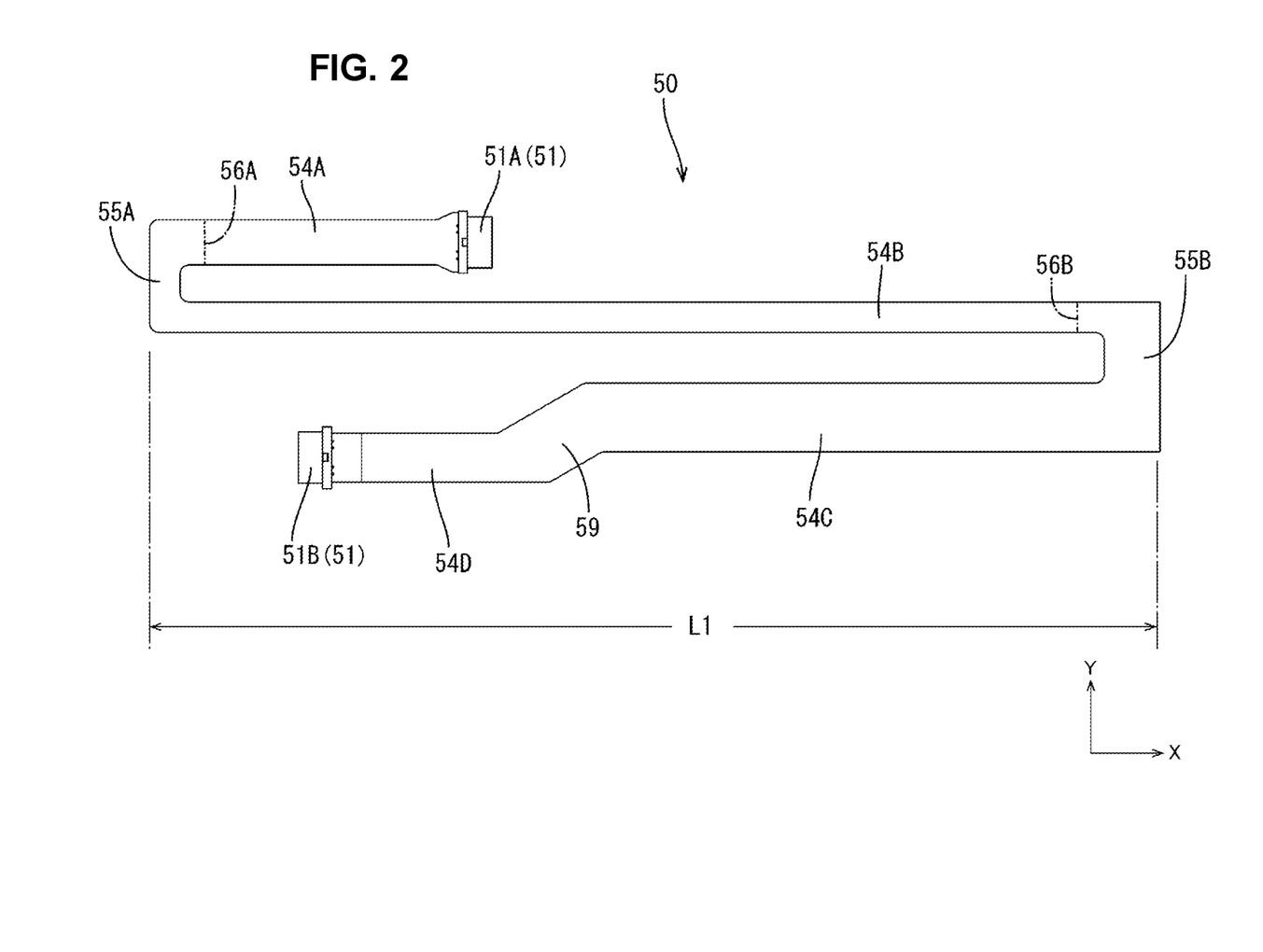
FIG. 2 is a plan view of a flexible printed circuit board that is not folded.
Figure 3:
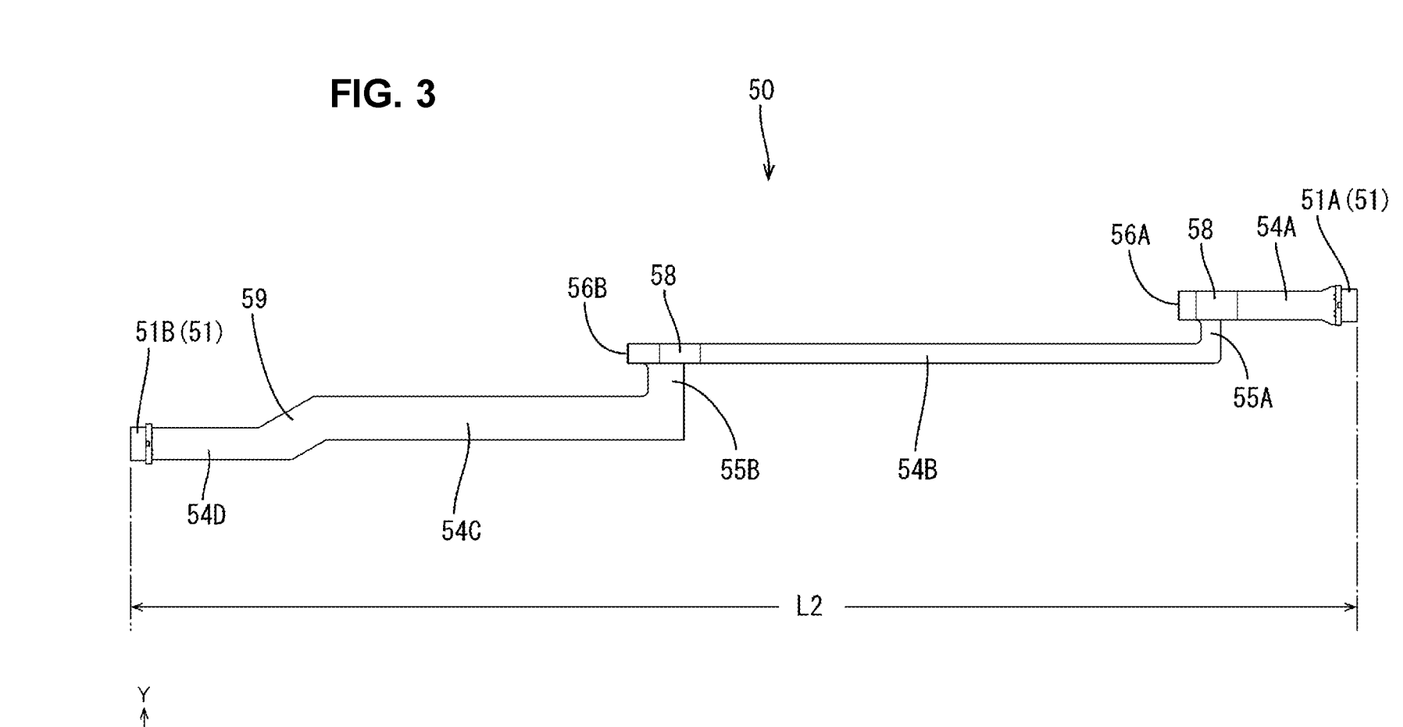
FIG. 3 is a plan view of the flexible printed circuit board that is folded.

The relay FPC 50 includes a base film 52A, a plurality of conductive paths 53 (an example of a conductor layer), and a coverlay film 52B (an example of a cover film), and is formed as a single-sided FPC, similarly to the protector-side FPC 40. The relay FPC 50 has a shape that is elongated in the front-rear direction as shown in FIGS. 2 and 3. The relay FPC 50 shown in FIG. 3 is folded back as described later, and an entire length L2 of the relay FPC 50 in the front-rear direction is longer than that of the relay FPC 50 when it is not folded back (FIG. 2). According to the present embodiment, for example, an entire length L1 of the non-folded relay FPC 50 in the front-rear direction (see FIG. 2) can be set to about 300 mm, and the entire length L2 of the folded relay FPC 50 in the front-rear direction (see FIG. 3) can be set to about 600 mm.

Counterpart Connectors

As shown in FIG. 2, the counterpart connectors 51 are respectively provided at the front end portion and the rear end portion of the relay FPC 50. The counterpart connector 51 at the front end portion is defined as a first counterpart connector 51A (an example of a counterpart connector) that is fitted to the connector 41 of the first bus bar module 11. The counterpart connector 51 at the rear end portion is defined as a second counterpart connector 51B (an example of a counterpart connector) that is fitted to the connector 41 of the second bus bar module 12. The first counterpart connector 51A and the second counterpart connector 51B are connected to conductive paths 53 of the relay FPC 50 through soldering in a similar manner to the soldering shown in FIG. 4, and are electrically connected to each other via the conductive paths 53.

Extension Parts and Intersection Parts

The relay FPC 50 in a non-folded state will be described with reference to FIG. 2. The relay FPC 50 has four extension parts 54A, 54B, 54C, and 54D extending in the front-rear direction, two intersection parts 55A and 55B extending in the horizontal direction, two bending parts 56A and 56B, and one step part 59. The step part 59 is formed to extend diagonally forward by extending in the horizontal direction and the front-rear direction. The front end portion of the extension part 54A is connected to the first counterpart connector 51A. The rear end portion of the extension part 54A is connected to the left end portion of the intersection part 55A. The right end portion of the intersection part 55A is coupled to the rear end portion of the extension part 54B. The front end portion of the extension part 54B is coupled to the left end portion of the intersection part 55B. The right end portion of the intersection part 55B is coupled to the front end portion of the extension part 54C. The rear end portion of the extension part 54C is coupled to the front end portion of the step part 59. The rear end portion of the step part 59 is coupled to the front end portion of the extension part 54D. The rear end portion of the extension part 54D is connected to the second counterpart connector 51B.

Bending Parts

As shown in FIG. 2, the bending part 56A is provided in the vicinity of the intersection part 55A in the extension part 54A. The vicinity of the intersection part 55A where the bending part 56A is located falls within a range in which, when the relay FPC 50 is bent at the bending part 56A, the entire length L2 of the relay FPC 50 in the front-rear direction is longer than that of the relay FPC 50 in the non-folded state. By folding the extension part 54A at the bending part 56A, the extension part 54A and the extension part 54B extend to opposite sides in the front-rear direction with reference to the intersection part 55A as shown in FIG. 3. In this example, the bending part 56A is preferably disposed toward the intersection part 55A of the extension part 54A (that is, toward the rear end portion) as much as possible. Turning back the extension part 54A in this arrangement can further increase the entire length L2 of the relay FPC 50 in the front-rear direction. On the other hand, if the bending part 56A is provided at a position toward the end portion on the side opposite to the intersection part 55A of the extension part 54A (that is, closer to the front end portion), even if the extension part 54A is folded, the extension parts 54A and 54B will extend forward with respect to the intersection part 55A, and the entire length L2 of the relay FPC 50 in the front-rear direction will not be increased. Therefore, the bending part 56A needs to be provided at least more on the intersection part 55A side (the rear side) relative to the central position of the extension part 54A in the front-rear direction. Similarly, as shown in FIG. 2, the bending part 56B is provided in the vicinity of the intersection part 55B in the extension part 54B.

As shown in FIG. 2, the longest portion of the non-folded relay FPC 50 in the front-rear direction is a central portion including the extension part 54B, and the entire length thereof in the front-rear direction is defined as L1. Thus, the relay FPC 50 can be formed using production facilities that can form an FPC that is longer than L1.

Notch

Figure 6:
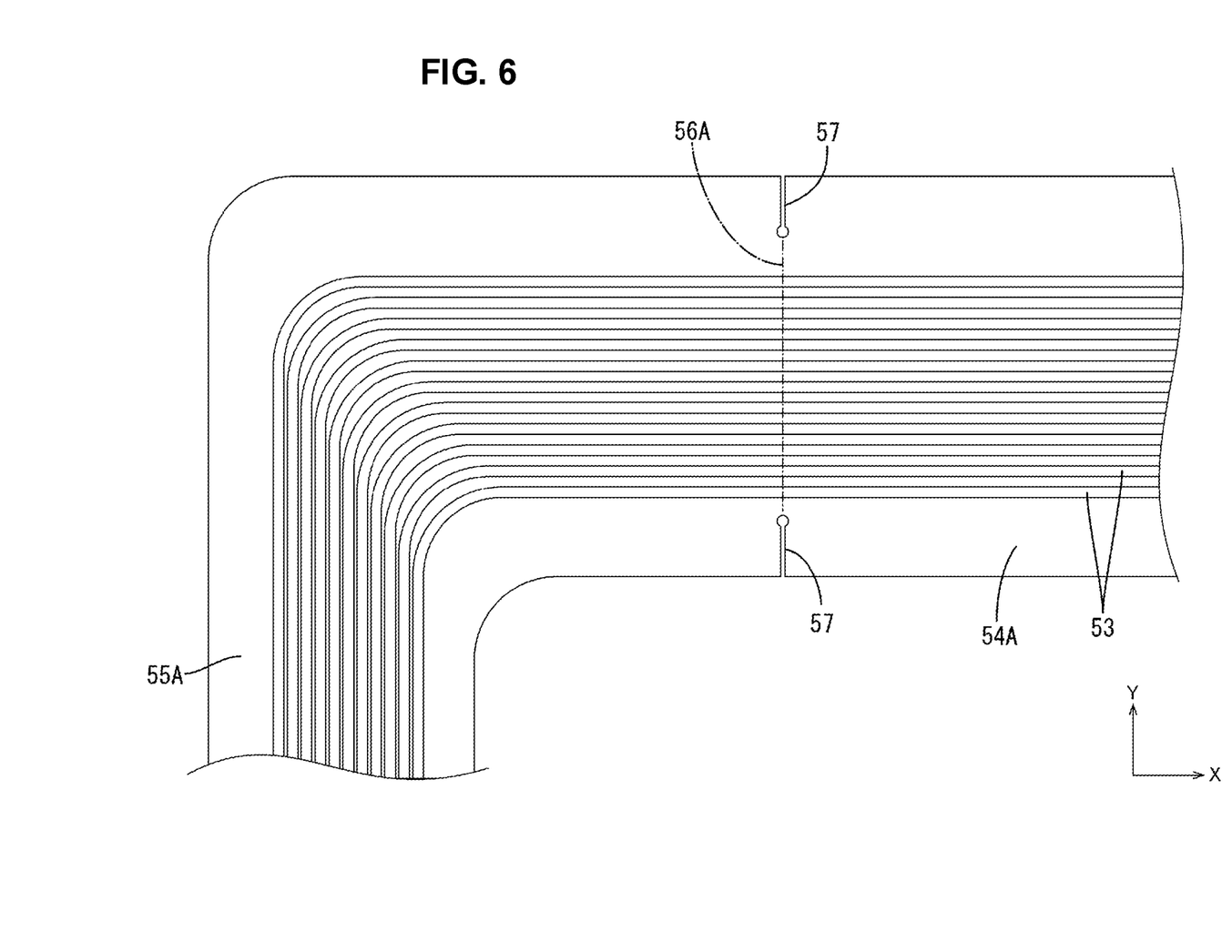
FIG. 6 is a plan view of notches in the flexible printed circuit board and their surrounding regions.

A pair of notches 57 are provided at right and left end portions of the bending part 56A as shown in FIG. 6. The notches 57 are formed by making notches in the right outer edge and left outer edge of the relay FPC 50 so as not to break the conductive paths 53. The leading end portions of the notches 57 on the conductive path 53 side have a circular shape such that the notches 57 are unlikely to spread toward the conductive paths 53 under an external force or the like. When turning back the relay FPC 50, the notches 57 serve as markers for the bending part 56A. In addition, the notches 57 reduce a reactive force generated at the time of turning back the bending part 56A so that the bending part 56A can be easily folded. Although not shown in the drawings or described herein, the notches 57 are similarly provided at the bending part 56B. The notches 57 and the conductive paths 53 are only shown in FIG. 6 and are not shown in the other drawings.

The relay FPC 50 is used in the wiring module 10 in the state of being folded at the bending parts 56A and 56B as shown in FIG. 3. The entire length of the turned relay FPC 50 in the front-rear direction is defined as L2, which is longer than the entire length L1 of the non-folded relay FPC 50 in the front-rear direction. The length of the relay FPC 50 in the horizontal direction can be adjusted by changing the lengths of the intersection parts 55A and 55B in the horizontal direction. That is, the lengths of the intersection parts 55A and 55B in the horizontal direction are set in accordance with the positions of the connectors 41 connected to the protector-sides FPC 40 and the counterpart connectors 51 connected to the relay FPC 50.

Fixing Part

Figure 5:
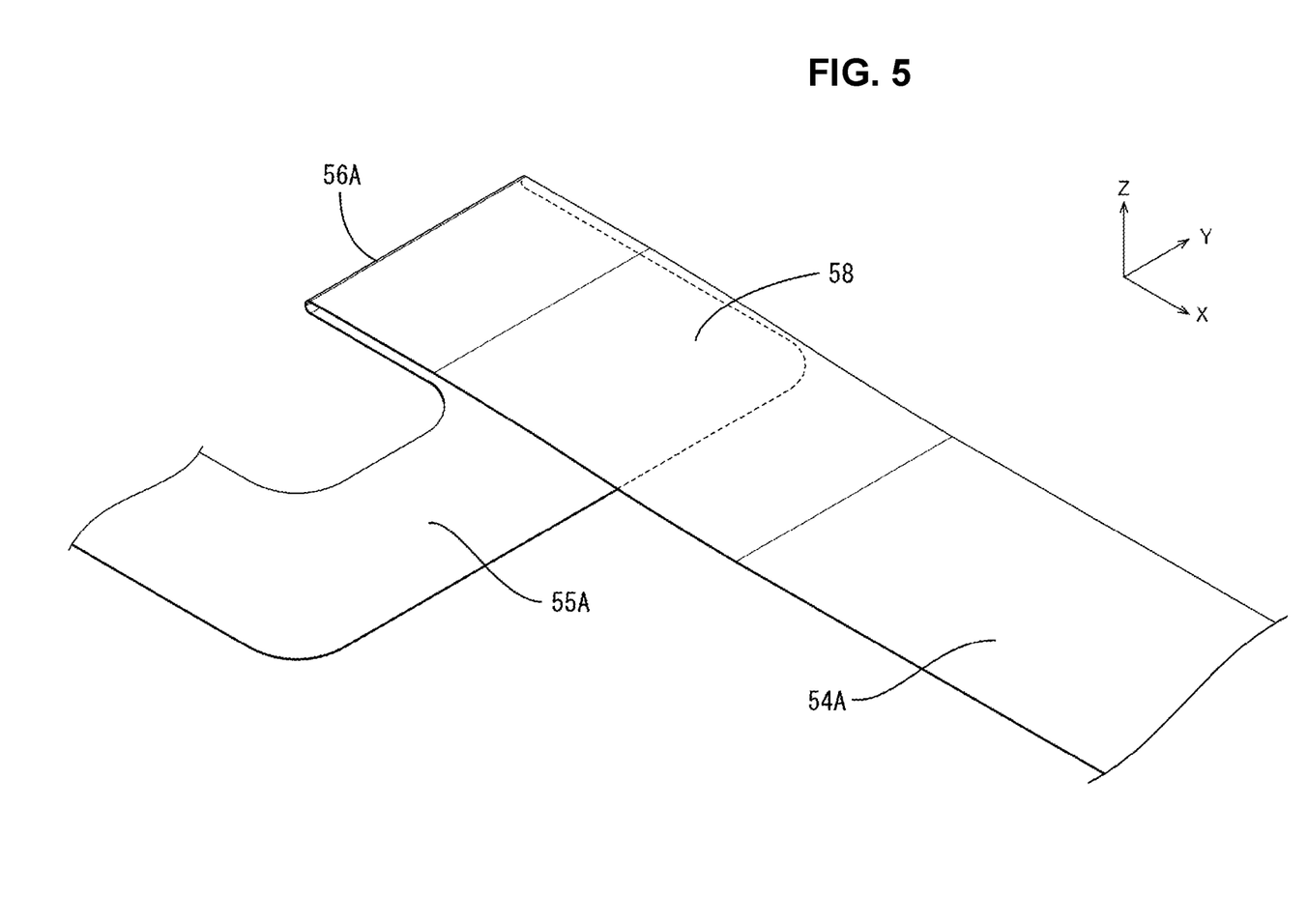
FIG. 5 is a perspective view of a fixing part of the flexible printed circuit board and its surrounding region.

As shown in FIG. 5, in the relay FPC 50, the extension part 54A disposed on one side and the intersection part 55A disposed on the other side centered around the bending part 56A are arranged so as to overlap each other in the vertical direction when the relay FPC 50 is folded. The overlapping portion between the extension part 54A and the intersection part 55A is fixed by a fixing part 58. The fixing part 58 can be formed using an adhesive agent, a piece of double-sided adhesive tape, or the like, for example. As shown in FIG. 3, a fixing part 58 is also provided at the overlapping portion between the extension part 54B and the intersection part 55B that are folded at the bending part 56B.

Since the relay FPC 50 is provided with the two bending parts 56A and 56B, the relay FPC 50 is folded twice overall. Since the relay FPC 50 is a single-sided FPC, when the relay FPC 50 is folded twice, the extension part 54A and the extension part 54D at the end portions of the relay FPC 50 have the same front-rear relationship. For example, the lowermost layer of the extension part 54A and the extension part 54D is the base film 52A. The first counterpart connector 51A connected to the extension part 54A and the second counterpart connector 51B connected to the extension part 54D are disposed on the same side (the upper side in FIG. 3) of the relay FPC 50. Therefore, in particular, if components are soldered only at two end portions of the relay FPC 50, the relay FPC 50 folded twice can be treated in the same manner as a single-sided FPC with the entire length L2.

As described above, in the present embodiment, even if an FPC with the length L2 cannot be formed, the relay FPC 50 with the entire length L2 in the front-rear direction can be formed by employing a folding structure, provided that production facilities are facilities where an FPC that is longer than L1 can be formed.

Attaching Wiring Module to Battery Cell Stacked Body

The first bus bar module 11 is attached to the front side of the battery cell stacked body 20L. The electrode leads 21 extending forward are inserted into the electrode receiving parts 71, and the electrode leads 21 and the bus bars 30 are joined to each other through laser welding. In a similar manner, the second bus bar module 12 is attached to the rear side of the battery cell stacked body 20L.

Next, the relay FPC 50 folded in advance is attached to the upper side of the battery cell stacked body 20L. The first counterpart connector 51A of the relay FPC 50 and the connector 41 of the first bus bar module 11 are fitted together, and the second counterpart connector 51B of the relay FPC 50 and the connector 41 of the second bus bar module 12 are fitted together, so that the first bus bar module 11 and the second bus bar module 12 are electrically connected to each other. As described above, attachment of the wiring module 10 to the battery cell stacked body 20L is complete.

Operations and Advantageous Effects of First Embodiment

The first embodiment provides the following operations and advantageous effects. The wiring module 10 according to the first embodiment is the wiring module 10 that is to be attached to the battery cell stacked body 20L in which the plurality of battery cells 20 having the electrode leads 21 and being elongated in the front-rear direction are arranged in a horizontal direction, and that is electrically connected to the battery cells 20, the wiring module 10 including: the bus bars 30 that are connected to the electrode leads 21; the FPC 60 that is connected to the bus bars 30 and extends in the front-rear direction; and the protector 70 that holds the bus bars 30 and the FPC 60, wherein the FPC 60 includes: the plurality of extension parts 54A, 54B, 54C, and 54D that extend in the front-rear direction; the intersection parts 55A and 55B that extend in the horizontal direction; and the bending parts 56A and 56B, the extension parts 54A and 54B are respectively coupled to two end portions of the intersection part 55A in the horizontal direction, the extension part 54A includes the bending part 56A in the vicinity of the intersection part 55A, the extension parts 54A and 54B extend to opposite sides in the front-rear direction with respect to the intersection part 55A as a result of the extension part 54A being folded at the bending part 56A, the extension parts 54B and 54C are respectively coupled to two end portions of the intersection part 55B in the horizontal direction, the extension part 54B includes the bending part 56B in the vicinity of the intersection part 55B, and the extension parts 54B and 54C extend to opposite sides in the front-rear direction with respect to the intersection part 55B as a result of the extension part 54B being folded at the bending part 56B.

According to the foregoing configuration, it is possible to provide the wiring module 10 that uses the FPC 60 extending in the front-rear direction by folding the FPC 60, without involving an increase in the scale of production facilities. Specifically, even if FPC production equipment that cannot form an FPC with a length larger than L2 is used, it is possible to form the FPC 60 in which the entire length in the front-rear direction can be extended to L2 by folding the FPC 60, and use the FPC 60 in the wiring module 10.

In the first embodiment, the FPC 60 includes the two connectors 41, the two counterpart connectors 51 respectively fitted to the two connectors 41, and the protector-side FPCs 40 and the relay FPC 50 that are electrically connected together by fitting the connectors 41 and the counterpart connectors 51 to each other, and the intersection parts 55A and 55B absorb misalignment between the connectors 41 and the counterpart connectors 51 in the horizontal direction.

According to the foregoing configuration, it is easy to attach the wiring module 10 to the battery cell stacked body 20L. For example, after completing connection between the electrode leads 21 and the bus bars 30, the connectors 41 and the counterpart connectors 51 can be fitted to each other, and the protector-side FPCs 40 and the relay FPC 50 can be connected to each other.

In the first embodiment, the FPC 60 includes the insulating base films 42A and 52A; the plurality of conductive paths 43 and 53 that are laminated on only one side of the base films 42A and 52A; and the coverlay films 42B and 52B that cover at least a portion of the plurality of conductor paths 43 and 53, and is provided with the two bending parts 56A and 56B.

According to the foregoing configuration, since the FPC 60 is bent twice, it is possible to expose the plurality of conductive paths 43 and 53 on the same side at two end parts of the FPC 60 in the front-rear direction with the FPC 60 being bent the minimum number of times. A configuration with an even number of bending parts equal to four or more would provide similar operation and effects. However, in the first embodiment, the two bending parts 56A and 56B are provided so that the structure can be simplified with the minimum number of bends.

In the first embodiment, the extension parts 54A and 54B disposed on one side and the intersection parts 55A and 55B disposed on the other side centered around the bending parts 56A and 56B are arranged so as to overlap in the vertical direction, and the overlapping portions are respectively fixed by the fixing parts 58.

According to the foregoing configuration, it is possible to suppress displacement of the bending parts 56A and 56B under an external force or the like.

In the first embodiment, the pair of notches 57 are provided at two end portions of each of the bending parts 56A and 56B.

According to the above configuration, it is easy to find the positions of the bending parts 56A and 56B. In addition, the reactive force generated when the FPC 60 is folded is reduced, and thus the FPC 60 can be easily bent.

In the first embodiment, the FPC 60 includes the land 43L, and the land 43L is connected to only one side surface of the bus bar 30 through soldering.

According to the foregoing configuration, it is possible to improve the work efficiency of soldering between the land 43L and the bus bar 30.

Second Embodiment

A second embodiment of the present disclosure will be described with reference to FIGS. 9 and 10. Hereinafter, the description of the members, operations, and advantageous effects of the second embodiment identical to those of the first embodiment will be omitted. In the following description, the direction indicated by the Z arrow is defined as the upper direction, the direction indicated by the X arrow is defined as the forward direction, and the direction indicated by the Y arrow is defined as the leftward direction. The front-rear direction is an example of a first direction, the horizontal direction is an example of a second direction, and the vertical direction is an example of a third direction. For a plurality of identical members, a reference sign may be given to only some, and may be omitted from the others.

In a wiring module of the second embodiment, an FPC 160 includes a relay FPC 150 instead of the relay FPC 50 in the first embodiment. Hereinafter, the relay FPC 150 will be described.

The relay FPC 150 in the second embodiment is identical in configuration to the relay FPC 50 except for an intersection part 155A. That is, the relay FPC 150 includes extension parts 54A, 54B, 54C, and 54D, intersection parts 55B and 155A, bending parts 56A and 56B, and a step part 59. As shown in FIGS. 9 and 10, an entire length (L1) of the folded relay FPC 150 in the front-rear direction and an entire length (L2) of the non-folded relay FPC 150 in the front-rear direction are equal to those of the relay FPC 50.

Figure 9:
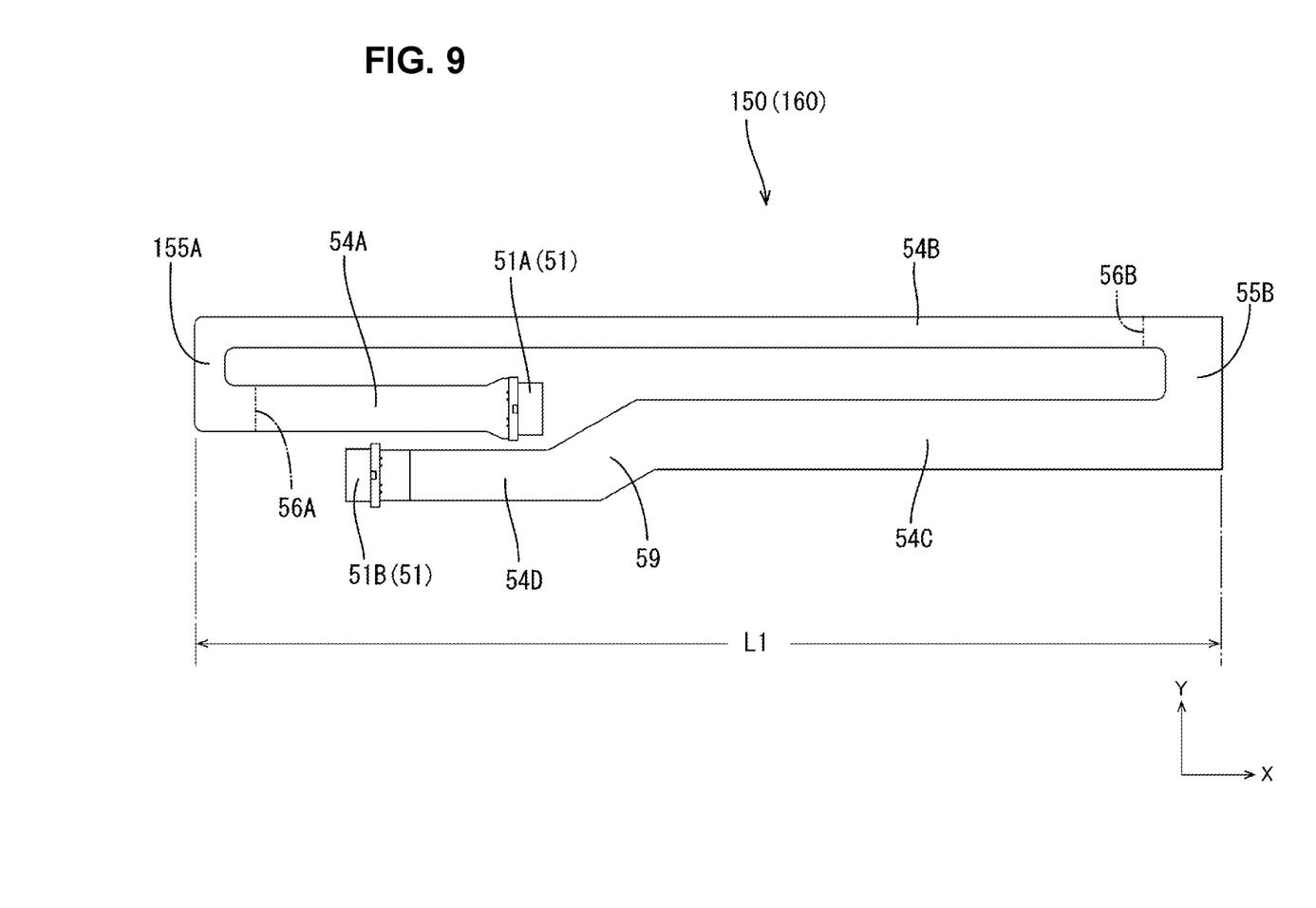
FIG. 9 is a plan view of a flexible printed circuit board according to a second embodiment that is not folded.
Figure 10:
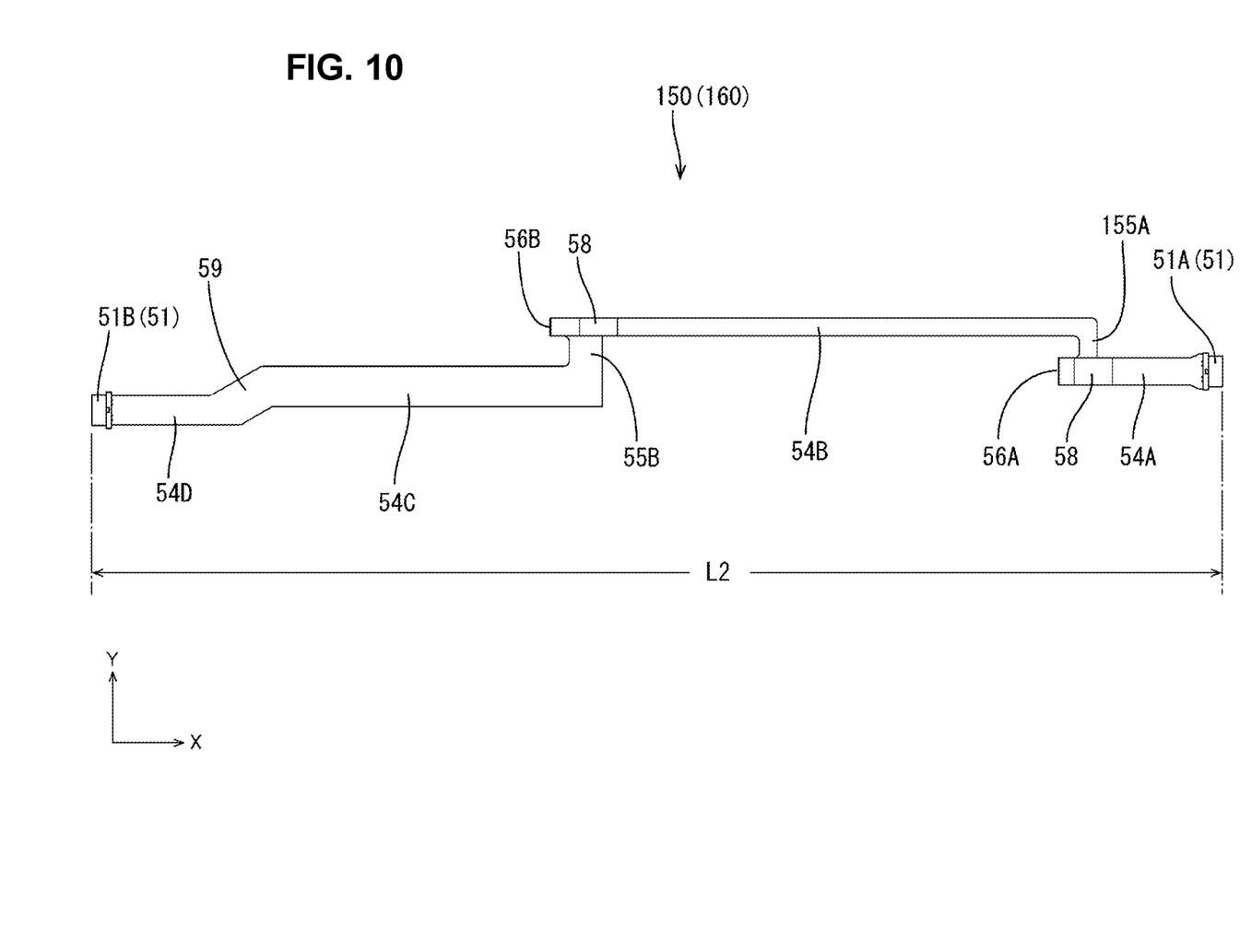
FIG. 10 is a plan view of the flexible printed circuit board that is folded.

As shown in FIG. 9, the rear end portion of the extension part 54A is coupled to the right end portion of the intersection part 155A. A bending part 56A is provided in the vicinity of the intersection part 155A in the extension part 54A. The left end portion of the intersection part 155A is coupled to the rear end portion of the extension part 54B. The intersection part 55A of the first embodiment is formed so as to extend rightward from the rear end portion of the extension part 54A, whereas the intersection part 155A is formed so as to extend leftward from the rear end portion of the extension part 54A Accordingly, the relay FPC 150 is configured such that the pair of intersection parts 55B and 155A are arranged between the pair of extension parts 54B and 54C in the horizontal direction.

Accordingly, the length of the relay FPC 150 in the horizontal direction is smaller than the length of the relay FPC 50 of the first embodiment in the horizontal direction, thereby achieving an improvement in the yield. In addition, the spacing between the first counterpart connector 51A and the second counterpart connector 51B in the horizontal direction can be set shorter. Accordingly, the spacing between the connector 41 of the first bus bar module 11 and the connector 41 of the second bus bar module in the horizontal direction can also be set shorter.

Operations and Advantageous Effects of Second Embodiment

According to the second embodiment, it is possible to realize the following operations and advantageous effects. In the horizontal direction, the pair of intersection parts 155A and 55B are disposed between the pair of extension parts 54B and 54C in the horizontal direction.

According to the foregoing configuration, it is possible to improve the yield of the FPC 160.

OTHER EMBODIMENTS (1) In the foregoing embodiments, the laminate-type battery cells 20 are used as power storage elements. However, the present disclosure is not limited to this, and power storage elements other than laminate-type battery cells may be used.

(2) In the foregoing embodiments, the FPCs 60 and 160 are divided. However, the present disclosure is not limited to this, and an FPC may be provided as a single body.

(3) In the foregoing embodiments, the FPCs 60 and 160 are a single-sided FPC and include the two bending parts 56A and 56B. However, the present disclosure is not limited to this, and an FPC may be a double-sided FPC in which electrically connected conductive layers are laminated in two sides of a base film and the conductive layers are covered by a cover film, and may include one or more bending parts.

(4) In the foregoing embodiments, the FPCs 60 and 160 are a single-sided FPC that is folded twice to expose the plurality of conductive paths 43 and 53 on the same side at two end portions of the FPCs 60 and 160 in the front-rear direction. However, the present disclosure is not limited to this. For example, the FPC may be a single-sided FPC and include an odd-number of bending parts to expose a plurality of conductive paths on opposite sides at two end portions of the FPC in the front-rear direction. Depending on the arrangement of connectors or the like, it may be more preferable to expose a plurality of conductive paths on opposite sides at two end portions of the FPC in the front-rear direction.

LIST OF REFERENCE NUMERALS

1 Battery module
10 Wiring module
11 First bus bar module
12 Second bus bar module
20 Battery cell
20L Battery cell stacked body
21 Electrode lead
30 Bus bar
31 Main body part
32, 41A Connection part
40 Protector-side FPC
41 Connector
42A, 52A Base film
42B, 52B Coverlay film
43, 53 Conductive path
43L Land
50, 150 Relay FPC
51 Counterpart connector
51A First counterpart connector
51B Second counterpart connector
54A, 54B, 54C, 54D Extension part
55A, 55B, 155A Intersection part
56A, 56B Bending part
57 Notch
58 Fixing part
59 Step part
60, 160 Flexible printed circuit board
70 Protector
71 Electrode receiving part
72 Groove part L1 Entire length of non-folded relay FPC in front-rear direction
L2 Entire length of folded relay FPC in front-rear direction
S Solder

The invention claimed is:

1. A wiring module that is to be attached to a power storage element group in which a plurality of power storage elements having an electrode terminal and being elongated in a first direction are arranged in a second direction intersecting the first direction, and that is electrically connected to the power storage elements, the wiring module comprising:
   a bus bar that is connected to the electrode terminal;
   a flexible printed circuit board that is connected to the bus bar and extends in the first direction; and
   a protector that holds the bus bar and the flexible printed circuit board,
   wherein the flexible printed circuit board includes a plurality of extension parts that extend in the first direction, an intersection part that extends in the second direction, and a bending part,
   two extension parts are respectively coupled to two end portions of the intersection part in the second direction,
   one of the two extension parts includes the bending part in the vicinity of the intersection part, and
   the two extension parts extend to opposite sides in the first direction with respect to the intersection part as a result of the one extension part being folded at the bending part.

2. The wiring module according to claim 1,
   wherein the flexible printed circuit board includes at least one connector, a counterpart connector that fits to the at least one connector, and two or more divided flexible printed circuit boards that are electrically connected to each other by fitting the connector and the counterpart connector to each other, and
   the intersection part absorbs misalignment of the connector and the counterpart connector in the second direction.

3. The wiring module according to claim 1,
   wherein, in the second direction, a pair of the intersection parts are disposed between a pair of the extension parts.

4. The wiring module according to claim 1,
   wherein the flexible printed circuit board includes an insulating base film, a conductor layer that is laminated on only one side of the base film, and a cover film that covers at least a portion of the conductor layer, and
   an even number of the bending parts are provided.

5. The wiring module according to claim 4,
   wherein two bending parts are provided.

6. The wiring module according to claim 1,
   wherein the extension part disposed on one side and the intersection part disposed on the other side centered around the bending part are arranged so as to overlap each other in a third direction intersecting the first direction and the second direction, and the overlapping portion is fixed by a fixing part.

7. The wiring module according to claim 1,
   wherein a pair of notches are respectively provided at two end portions of the bending part.

8. The wiring module according to claim 1,
   wherein the flexible printed circuit board includes a land, and
   the land is connected to at least one side surface of the bus bar through soldering.

9. The wiring module according to claim 8,
   wherein the land is connected to only one side surface of the bus bar through soldering.

* * * * *